(12) United States Patent
Loewenhardt et al.

(10) Patent No.: US 6,558,564 B1
(45) Date of Patent: May 6, 2003

(54) PLASMA ENERGY CONTROL BY INDUCING PLASMA INSTABILITY

(75) Inventors: Peter K. Loewenhardt, San Jose, CA (US); Wade Zawalski, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/543,392

(22) Filed: Apr. 5, 2000

(51) Int. Cl.[7] .................. B44C 1/22; H01L 21/302
(52) U.S. Cl. .............. 216/67; 216/68; 216/69; 216/71; 438/714; 438/729; 427/569
(58) Field of Search ............... 438/714, 729; 216/67, 68, 69, 71; 427/569

(56) References Cited

U.S. PATENT DOCUMENTS

| | | | |
|---|---|---|---|
| 4,733,133 A | | 3/1988 | Dandl |
| 5,277,752 A | | 1/1994 | Aydil et al. |
| 5,571,366 A | | 11/1996 | Ishii et al. ............... 156/345 |
| 5,779,925 A | * | 7/1998 | Hashimoto et al. ......... 216/67 |
| 6,022,460 A | * | 2/2000 | O et al. ............... 204/298.06 |
| 6,030,667 A | * | 2/2000 | Nakagawa et al. ......... 427/569 |
| 6,051,151 A | * | 4/2000 | Keller et al. ............... 216/68 |
| 6,054,063 A | * | 4/2000 | Ohtake et al. ............ 216/70 |
| 6,085,688 A | * | 7/2000 | Lymberopoulos et al. ............ 118/723 I |
| 6,247,425 B1 | * | 6/2001 | Lymberopoulos et al. ............ 118/723 I |
| 6,287,986 B1 | * | 9/2001 | Mihara ................ 438/763 |
| 2001/0019746 A1 | * | 9/2001 | Higashikawa et al. ...... 427/569 |

FOREIGN PATENT DOCUMENTS

| | | |
|---|---|---|
| WO | WO 99/50883 | 10/1999 |

OTHER PUBLICATIONS

Patent Abstracts of Japan, Publication No. 1134569, Dec. 12, 1999 (Fujistsu LTD).

Samukawa, Seiji, "Highly Selective and Highly Anisotropic $SiO_2$ Etching in Pulse–Time Modulated Electron Cyclotron Resonance Plasma," Jpn. Appl. Phys., vol. 33, 1994, pp. 2133–2138.

Samukawa, Seiji, "Pulse–time–modulated electron cyclotron resonance plasma etching for highly selective, highly anisotropic, and notch–free polycrystalline silicon patterning," Appl. Phys. Lett., vol.64, No. 25, Jun. 20, 1994, pp. 3398–3400.

Samukawa, Seiji and Terada, Kazuo, "Pulse–time Modulated ECR Plasma Etching for Highly Selective, Highly Anisotropic and Less–Charging Poly–Si Gate Patterning," Digest of 1994 Symposium on VLSI Technology (IEEE, Apr., 1994), pp. 27–28.

Samukawa, Seiji and Mieno, Tetsu, "Pulse–time modulated plasma discharge for high;y selective, highly anisotropic and charge–free etching," Plasma Sources Sci. Technol., vol. 5, 1996.

\* cited by examiner

*Primary Examiner*—George Goudreau
(74) *Attorney, Agent, or Firm*—Robert M. Wallace; Joseph Bach

(57) ABSTRACT

In the present invention, electron temperature is controlled by modifying the power delivered to the plasma by inducing or enhancing natural instabilities between the plasma and the power source. As a result, no pulse modulation of the RF power or RF generator is required. The instability is enhanced until the desired reduction in electron temperature has been achieved. In accordance with the invention, there are several modes for inducing such a natural instability.

4 Claims, 4 Drawing Sheets

| LOOK UP TABLE | | | | |
|---|---|---|---|---|
| $e$–TEMP | CHAMBER PRESSURE | Z–MATCH COMPONENT VALUE | RF FREQUENCY | $e$–BEAM CURRENT |
| | | | | |

PLASMA ENERGY CONTROL BY INDUCING PLASMA INSTABILITY

BACKGROUND OF THE INVENTION

One problem encountered in high-density plasma reactors used to process semiconductor wafers in the production of integrated circuits is electrical charge damage to certain integrated circuit features on the wafer. Charge damage is caused by the difference in velocity distributions of electrons and ions near the wafer surface in surface features having relatively high aspect ratios. The velocity distribution of the plasma ions is vertical, due to the vertical electric field lines near the surface of the wafer induced by an RF bias signal applied to the wafer. The velocity distribution of the plasma electrons approaches an isotropic distribution despite the vertical electric field lines near the wafer surface because of the high electron temperature characteristic of a high density plasma reactor. Thus, in very deep narrow holes, such as contact openings, the vertical trajectory of the ions enables them to travel completely down the entire depth of the opening, so that they nearly all strike the bottom of the opening. In contrast, the nearly isotropic velocity distribution of the electrons enables them to strike the sidewall of the opening, so that only a relatively small portion of the electrons are able to strike the bottom of the opening. As a result, the bottom of the opening acquires a positive charge while the top of the opening acquires a negative charge. As electron temperature increases, this effect is exacerbated and the resulting internal electric fields within the microelectronic features on the wafer can damage those features, resulting in device failure.

RF plasma source power modulation, sometimes referred to as plasma pulsing, is a well-known technique for modifying average plasma electron temperature and plasma chemistry, by pulsing (time-modulating) the RF plasma source power signal. This technique provides some control of electron temperature independent of the RF plasma source power level. This is because the electron temperature decreases at a much quicker rate than plasma density during the power off time between pulses. This control is gained by choosing an appropriate pulse width and pulse repetition rate of the pulse-modulated plasma RF power source so as to reduce the electron temperature without having to reduce the power level.

Pulse-modulating the RF plasma source power has the advantage of not requiring a drastic change in power level to reduce electron temperature. However, this technique does require the RF plasma source power to be modified by pulse modulation. It is a goal of the present invention to reduce plasma electron temperature without having to modify the plasma source power generator (e.g., by the introduction of pulse modulation).

SUMMARY OF THE INVENTION

In the present invention, electron temperature is controlled by inducing or enhancing natural instability waves in the plasma.

DETAILED DESCRIPTION OF THE PREFERRED EMBODIMENTS

Figure 1:
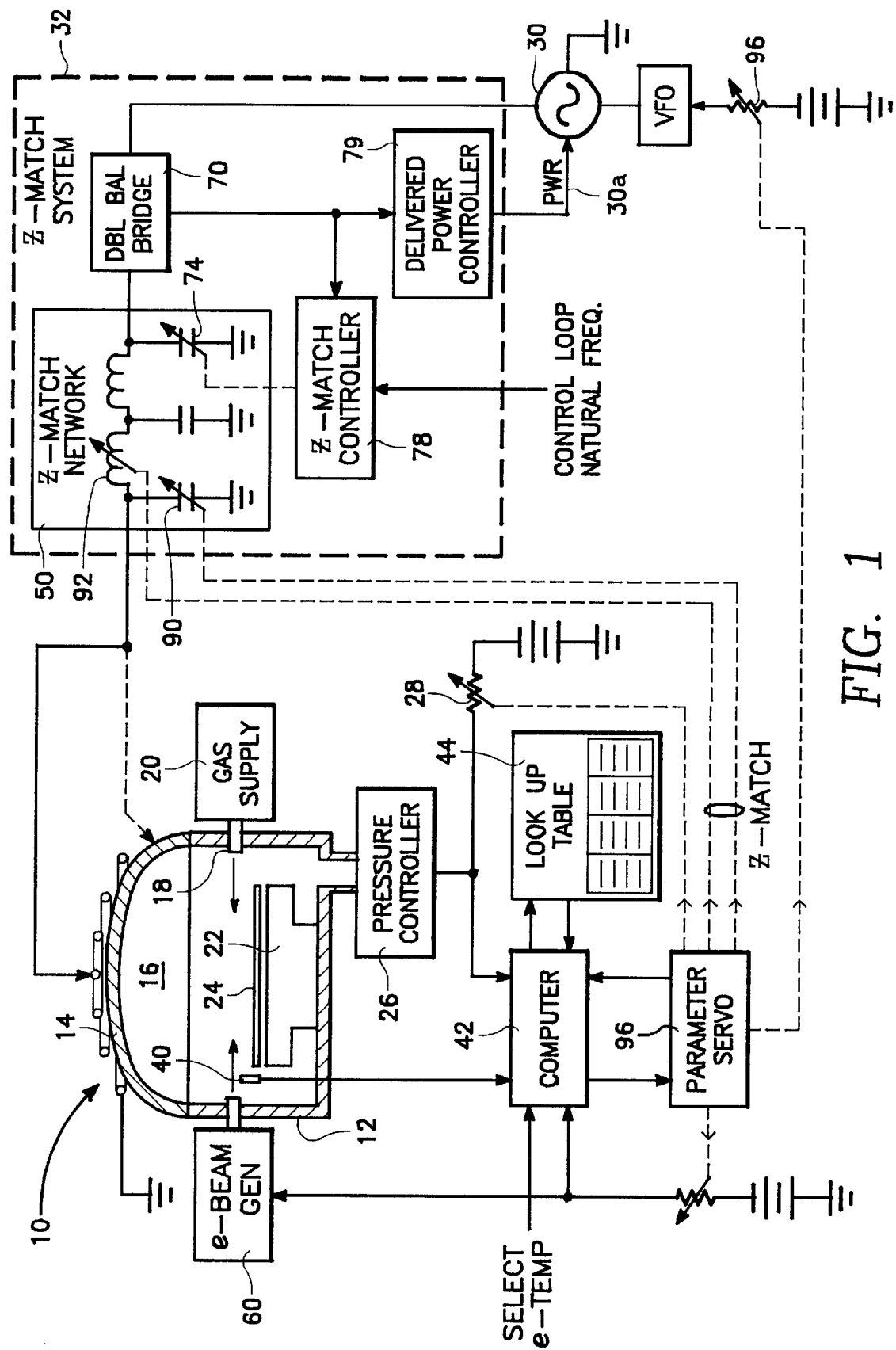
FIG. 1 is a schematic diagram of a plasma reactor system embodying the invention.

In the present invention, electron temperature is controlled by inducing or enhancing natural instability waves in the plasma. This can be accomplished by introducing instabilities between the plasma and the power source. As a result, no pulse modulation of the RF power or RF generator is required, a significant advantage. The instability is enhanced until the desired reduction in electron temperature has been achieved. In accordance with the invention, there are several modes for inducing such a natural instability.

In an electro-negative plasma, the rate of electron attachment is enhanced by increasing the reactor chamber pressure. As the electron attachment rate increases, the loss of electrons can lead to an instability between the plasma and the feedback control system regulating the RF plasma source power generator, causing fluctuations in the delivered RF power. The chamber pressure preferably is increased so as to increase such RF power fluctuations until a desired decrease in plasma electron temperature has been achieved.

In an electro-positive plasma, the rate of ion recombination is enhanced by introducing an electron beam into the plasma from an e-beam generator. Introduction of the additional electrons by the e-beam generator increases the rate of ion-to-electron recombination and can also lead to beam-plasma interaction instabilities. The resulting loss in ion density leads to an instability between the plasma and the feedback control system regulating the RF plasma source power generator, causing fluctuations in the delivered RF power. The electron beam current preferably is increased so as to increase such RF power fluctuations until a desired decrease in plasma electron temperature has been achieved.

In either an electro-negative or electro-positive plasma, natural plasma instabilities are enhanced by introducing an instability between the load impedance presented by the plasma and the impedance match feedback control system of the RF plasma source power generator. This is accomplished by changing a selected parameter of the impedance match network in such a way as to change the impedance match space relative to the load impedance presented to the RF generator until the impedance match feedback control network enters an unstable regime in which it fluctuates or oscillates. The impedance match network typically includes an element having a variable reactance which the impedance match feedback control system varies to minimize the amount of power reflected back to the RF generator. The fluctuations of the impedance match feedback control system are manifested as fluctuations in the reactance of the variable reactance element or in delivered power in systems where forward power is servoed. These fluctuations can couple with natural plasma instabilities such as drift waves and ion acoustic waves, causing fluctuations in the power delivered to the plasma. The selected parameter of the impedance match network is modified until these fluctuations reach a level at which the electron temperature has been decreased by a desired amount. The selected parameter of the impedance match network may be the reactance of an otherwise fixed element (e.g., a capacitor or inductor) within the impedance match network, the frequency of the RF power generator or the Q of the impedance match feedback control system. The frequency of the RF power generator is changed by, for example, changing the control voltage applied to a voltage controlled oscillator (VFO) of the generator. The Q of the control system may be changed by, for example, changing the value of a resistor or an RC time constant within the impedance match feedback control system.

Preferably, the foregoing methods of the invention are carried out by observing electron temperature using a conventional electron temperature probe such as a Langmuir probe placed inside the reactor chamber. In addition, a computer may be employed to record measured electron temperature across a range of values of the selected parameter (e.g., where the selected parameter is one of the following: chamber pressure, e-beam current, impedance match network element reactance, RF frequency or match Q). With this information, a look-up table is constructed for use in a production plasma reactor having no electron-temperature sensitive probe. The look-up table determines which parameter value is appropriate for a desired electron temperature level. The desired electron temperature level can be determined by trial and error by processing a number of wafers with identical microelectronic features at different electron temperature levels and measuring the amount of charge damage on each wafer. The wafers may be processed sequentially in the same reactor at progressively decreasing levels of electron temperature until a wafer is processed in which the measured amount of charge damage reaches an acceptable level or disappears altogether, the electron temperature environment of this wafer being the desired electron temperature.

Referring to FIG. 1, a plasma reactor 10 has a cylindrical side wall 12 and a ceiling 14 which may be dome-shaped, the wall 12 and ceiling 14 defining a vacuum chamber 16 into which process gases are introduced through a gas inlet 18 from a gas supply 20. A workpiece support 22 supports a semiconductor wafer 24. Gas pressure within the chamber 16 is controlled by a pressure control system 26 which includes a vacuum pump and a pressure sensor (not shown). Chamber pressure is commanded by an applied voltage controlled, in a simplified example, by a variable resistor 28. RF plasma source power, i.e., that power required to ionize the process gases in the chamber to generate a plasma, is supplied from an RF power generator 30 through a impedance match system 32 to an RF power applicator. Preferably, the reactor 10 provides a high density plasma by inductively coupling the source power into the chamber 16. In this case, the RF power is applied to an inductive antenna 34 overlying the ceiling 14.

The impedance match system 32 is of the conventional type which includes a bridge circuit 70 connected in series between the output of the RF generator 30 and the impedance match network 50, the bridge circuit 70 being of the conventional type which separates forward voltage from reflected voltage. The impedance match network 50 includes passive reactive elements, capacitors and inductors, defining the match space of the impedance match system 32. At least one of the reactive elements is variable, such as the variable capacitor 74. The impedance of the variable capacitor 74 is controlled in a feedback loop consisting of a conventional impedance match controller 78. The controller's output is connected to vary the variable capacitor 74 and the controller's error input is connected to the reflected voltage output of the bridge circuit 70. The controller 78 thus varies the capacitor 74 in such a manner as to minimize the reflected voltage at the generator 30. At zero reflected voltage, the output impedance presented by the generator 30 and impedance match network 50 equals the load impedance presented by the chamber and plasma.

The reactor may further include a conventional delivered power controller 79. The delivered power controller 79 typically is programmed to maintain forward power, as sensed on the double balanced bridge 70, at a particular level. For this purpose the delivered power controller 79 has a control output coupled to a power level control input 30a of the RF generator 30. The delivered power controller 79 reduces the control voltage at the generator's control input 30a whenever the forward power sensed at the bridge 70 exceeds the desired level and increases it whenever the forward power falls below the desired level.

In accordance with a first embodiment of the invention, the gas supply 20 furnishes electro-negative gases into the chamber 16, such as SF6 for a tungsten etch process or Cl2 for a metal or polysilicon etch process, for example. Generally, such process are carried out at a chamber pressure below 30–50 mT. In accordance with the present invention, the chamber pressure is increased into the range of 30–50 mT to promote electron attachment in the electro-negative plasma. This changes the load impedance of the plasma presented to the generator 30, which the impedance match system 32 overcorrects, creating an instability in the plasma, manifested as fluctuations in the delivered power from the generator 30. The chamber pressure is increased in this manner until the fluctuations in delivered RF power cause the plasma electron temperature to decrease to a desired level, such as a level at which charge damage to microelectronic features on the wafer 24 does not occur. The electron temperature is measured in an experimental version of the reactor 10 which is specially modified to include an electron-temperature-sensitive probe 40, such as a Langmuir probe, for example. The output of the probe is fed to a computer 42. The computer 42 may be programmed to correlate electron temperature measurements from the probe with instantaneous chamber pressure values from the pressure controller 26. Thus, as chamber pressure is increased, the computer 42 can form a look-up table 44 correlating chamber pressure and electron temperature. In the production version of the chamber 10, there is no probe 40, and the desired electron temperature is reached by referring in the look-up table 44 to the chamber pressure corresponding to the desired electron temperature.

Figure 2:
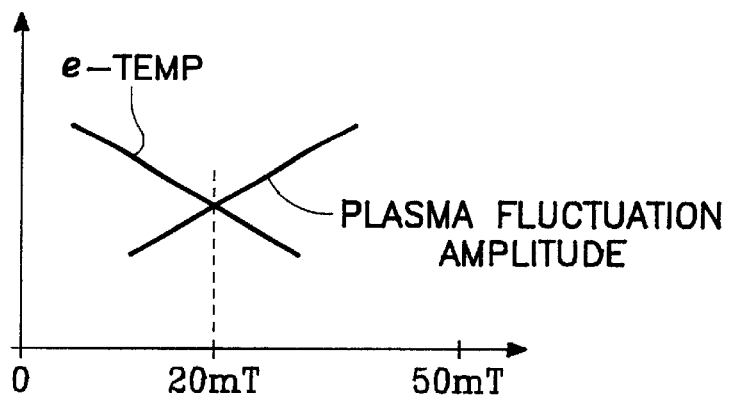
FIG. 2 is a graph illustrating the effects of chamber pressure in an electro-negative plasma on electron temperature and on plasma fluctuation amplitude.

FIG. 2 illustrates in a qualitative manner the approximate behavior of the electron temperature with the chamber pressure: As chamber pressure increases, the electron temperature decreases. FIG. 2 also illustrates the amplitude of fluctuations in the delivered RF power to the plasma as a function of chamber pressure: As the chamber pressure is increased, the rate of electron attachment to neutral species, to form anions, increases. In an inductively coupled plasma, electrons and not ions are accelerated by the applied RF field, and are necessary to impart kinetic energy to the process gas for ionization. Thus, electron attachment decreases electron density, thereby changing the load impedance presented to the generator 30. In response, the impedance match system 32 overcompensates by changing the impedance of a match network 50. Alternatively, if the system includes a forward power servo control system of the conventional type such as the delivered power controller 79 of FIG. 1, then such changes may cause the controller 79 to overcorrect the delivered (forward) power. In either case, the resulting overcorrection in plasma ion density causes the match system 32 to overcorrect in the opposite direction, leading to oscillations. These oscillations cause oscillations in the power coupled to the plasma, so that the average electron temperature falls, as illustrated in FIG. 2.

Figure 3:
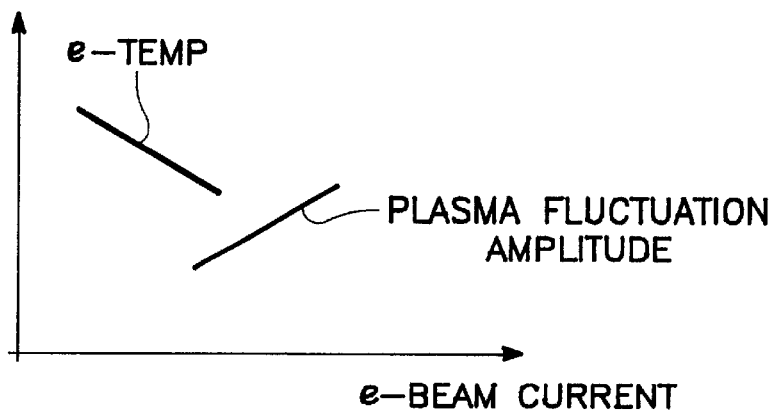
FIG. 3 is a graph illustrating the effects of e-beam current on electron temperature and on plasma fluctuation amplitude.

In a second embodiment of the invention, an electropositive gas is supplied by the gas supply 20 into the chamber 16. Natural instabilities between the plasma and the generator 30 are induced by introducing an electron beam from an e-beam generator 60 into the chamber 16. The additional electrons thus introduced increase the rate at which plasma ions are lost to recombination with electrons, or can introduce a plasma-electron beam interaction instability. The loss of plasma ion density causes a change in the plasma load impedance presented to the generator 30. In response, the impedance match system 32 overcompensates by changing the impedance of a match network 50. Alternatively, if the system includes a forward power servo control system of the conventional type such as the delivered power controller 79 of FIG. 1, then such changes may cause the controller 79 to overcorrect the delivered (forward) power. In either case, the resulting overcorrection in plasma ion density causes the match system 32 to overcorrect in the opposite direction, leading to oscillations. These oscillations cause oscillations in the power coupled to the plasma which increase as the electron beam current is increased, so that the average electron temperature falls with increasing e-beam current, as illustrated in FIG. 3. The e-beam current is controlled, in a simple example, by a variable resistor 62 connected to a control input of the e-beam generator 60. Preferably, the e-beam current is increased until the requisite decrease in plasma electron temperature is achieved. The computer 42 receives the e-beam current setting at the input to the e-beam generator 60, so that the computer 42 can form the look-up table 44 to correlate e-beam current with plasma electron temperature.

FIG. 3 illustrates in a qualitative manner the approximate behavior of the electron temperature with the e-beam current: As the e-beam current increases, the electron temperature decreases. FIG. 2 also illustrates the amplitude of fluctuations in the delivered RF power to the plasma as a function of the e-beam current: As the e-beam current is increased, the rate of ion-to-electron recombination increases. In an inductively coupled plasma, electrons and not ions are accelerated by the applied RF field, and are necessary to impart kinetic energy to the process gas for ionization. Thus, recombination decreases electron density, thereby changing the load impedance presented to the generator 30. In response, the impedance match system 32 overcompensates by changing the impedance of a match network 50. Alternatively, if the system includes a forward power servo control system of the conventional type such as the delivered power controller 79 of FIG. 1, then such changes may cause the controller 79 to overcorrect the delivered (forward) power. In either case, the resulting overcorrection in plasma ion density causes the match system 32 to overcorrect in the opposite direction, leading to oscillations. These oscillations cause oscillations in the power coupled to the plasma, so that the average electron temperature falls, as illustrated in FIG. 3.

In a third embodiment of the invention, plasma instabilities are introduced by modifying the match space of the impedance match system 32 relative to the plasma load impedance presented to the RF generator 30.

Figure 4:
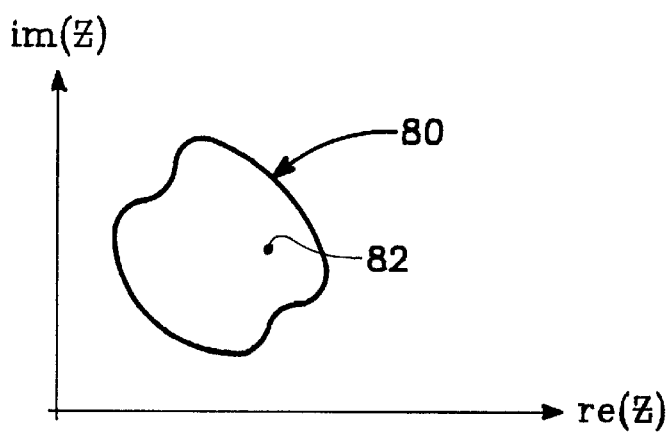
FIG. 4 is a graph illustrating the impedance match space of the impedance match network of the system of FIG. 1.

As discussed above with reference to FIG. 1, The controller 78 may vary the reactance of a variable reactive element, which may be the capacitor 74, in such a manner as to minimize the reflected voltage at the generator 30. At zero reflected voltage, the output impedance presented by the generator 30 and impedance match network 50 equals the load impedance presented by the chamber and plasma. Significantly, the stability of the feedback control loop including the controller 78 is limited to a "match space" of load impedances in the complex impedance plane. FIG. 4 illustrates a match space 80 within which the plasma load impedance 82 is included. For load impedances outside of the match space, the system is not stable or cannot match the load impedance. The match space 80 is determined by the individual component values of the impedance match network 50 and by the frequency of the RF generator 30.

In carrying out the third embodiment of the invention, the match space is modified so that the load impedance of the plasma is at least nearly outside of the impedance match space. As a result, operation of the impedance match system is unstable, so that the system fluctuates between impedance match and mismatch conditions. As the controller 78 is forced to servo the variable capacitor 74 back and forth, the delivered power to the plasma fluctuates. Such fluctuations promote natural instabilities in the plasma, such as drift waves and ion acoustic waves. The result is that the delivered power fluctuations reduce the electron temperature, which is the desired effect.

Changing the match space may be accomplished by altering the reactance of one of the fixed capacitors or inductors in the impedance match network 50, such as the capacitor 90 or the inductor 92. The selected element is varied from the norm until the resultant fluctuations in delivered power reduce the electron temperature as desired.

Figure 5:
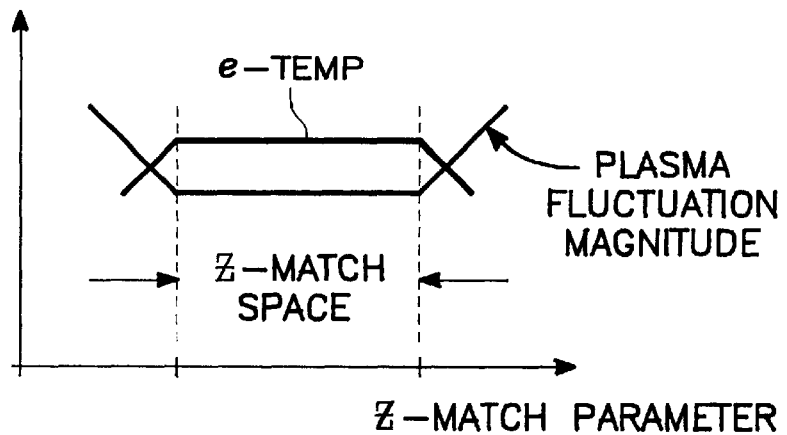
FIG. 5 is a graph illustrating the effects of changing a parameter of the impedance match system on electron temperature and on plasma fluctuation amplitude.

FIG. 5 illustrates the effect of changing the capacitance of the capacitor 90. This capacitance corresponds to the "Z-match parameter" of FIG. 5. FIG. 5 illustrates that there is a range for this parameter within which it falls within the match space of the system. FIG. 5 illustrates that while the Z-match parameter (e.g., the capacitance of the capacitor 90) is confined within the range corresponding to the Z-match space, the plasma fluctuation magnitude is minimum and the electron temperature is maximum.

As the Z-match parameter deviates from this range, either by going above it (to the left in the graph of FIG. 5) or below it (to the right in the graph of FIG. 5), the plasma fluctuation amplitude increases while the electron temperature decreases.

Alternatively, the match space may be changed by changing the frequency of the RF generator 30. This may be accomplished by changing in input voltage to a VFO 94 of the RF generator 30, for example by controlling variable resistor 96.

Yet another way of changing the match space is to change the Q (speed) of the controller 78. This is accomplished using conventional controls provided with the conventional controller 78. Typically, an RC constant within the controller 78 may be altered by changing a variable resistor therein. This may have the effect of changing the natural response frequency of the control loop that includes the Z-match controller 79, the bridge 70 and the variable reactance (e.g., the capacitor 74). The methods for doing this are not within the scope of the present invention and are well-known in the art.

A central controller 96 may be provided which can be controller by the computer 44 to vary any one of the parameters discussed above to achieve the requisite reduction in electron temperature. Thus, the central controller 96 is able to change the chamber pressure to implement the first embodiment of the invention, the e-beam current to implement the second embodiment of the invention, or a parameter of the impedance match system to implement the third embodiment of the invention. This latter parameter may be a fixed reactance within the impedance match network 50, the frequency of the RF generator 30 or the Q or natural response frequency of the control loop of the impedance match controller 78.

Figure 6:
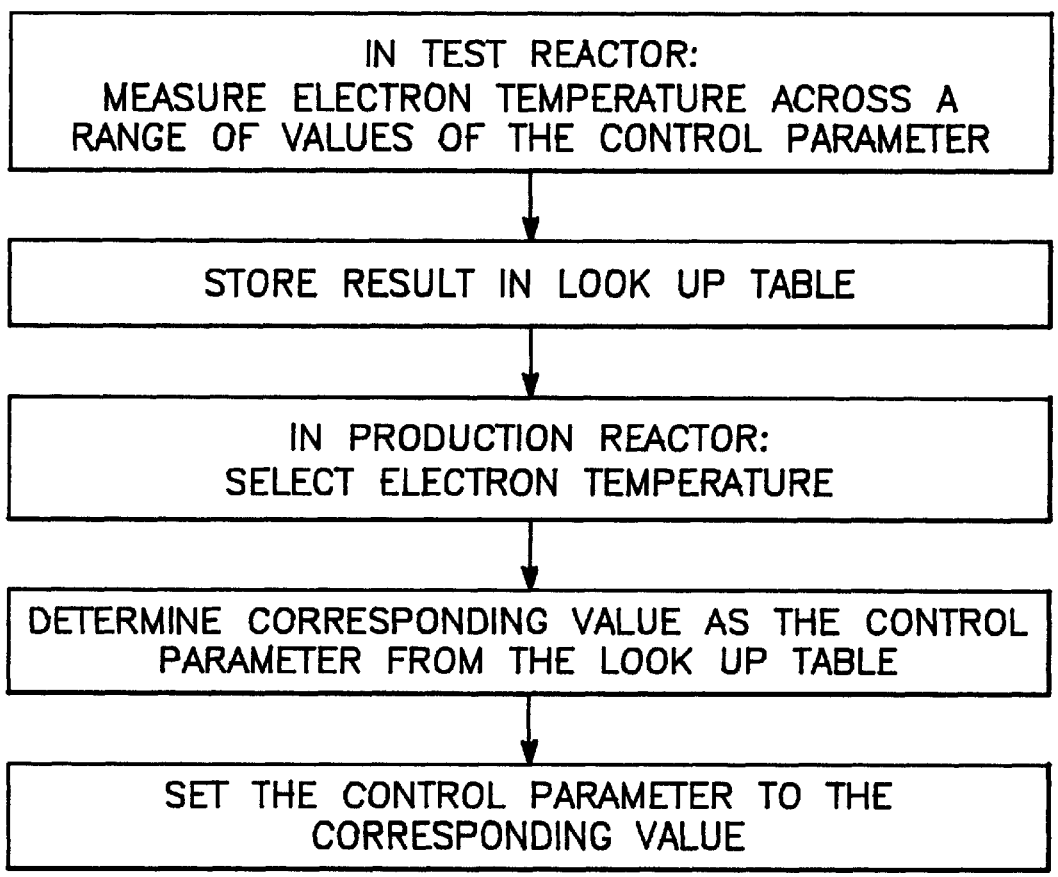
FIG. 6 is a block diagram illustrating a method of the invention including the generation and use of a look-up table correlating electron temperature and a selected control parameter of the system.

The invention may be carried out using the method of FIG. 6. First, using an experimental version of the reactor 10 of FIG. 1 which includes the electron temperature-sensitive probe 40, a control parameter (e.g., chamber pressure) is selected and electron temperature is measured across a range of values of this parameter (block 600 of FIG. 6). This step may be carried out for each one of the parameters discussed above. Each measurement is recorded to form a look-up table correlating electron temperature with values of the selected parameter (block 610 of FIG. 6). Then, a production version of the reactor 10 of FIG. 1 is then operated by first selecting a desired (reduced) electron temperature (block 620). The corresponding value of the selected parameter is then determined from the look-up table (block 630). The reactor is then operated with the parameter (e.g., chamber pressure) set to the corresponding value.

Figures 7, 8:
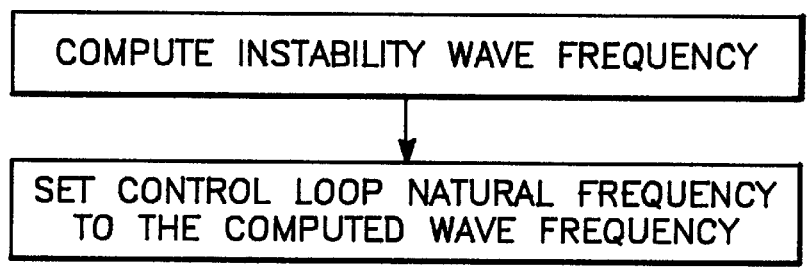
FIG. 7 illustrates a look-up table employed in carrying out the method of FIG. 6.
FIG. 8 illustrates one method of controlling the frequency of the impedance match system to achieve desired plasma fluctuations.

The look-up table 44 constructed in the process of FIG. 6 may take the form illustrated in FIG. 7, in which measured electron temperature is given across a range of values for each one of the parameters, including chamber pressure, e-beam current, match network component value, RF frequency and Q.

FIG. 8 illustrates one method of achieving desirable plasma fluctuations to modulate or control electron temperature by controlling the Q or natural frequency of the impedance match control loop referred to above. The first step is to compute the frequency of an instability wave that can be excited in the plasma. For example, a plasma drift wave has a frequency governed by the following equation:

$$f_{drift\ wave} = f^2_{electron\ collision} / \{f_{plasma} \nabla_\rho \text{plasma density}|_{sheath}\}$$

Once the instability wave frequency has been determined (block 810 of FIG. 8), the natural frequency of the control loop of the match controller 78 is set to the computed frequency of the instability wave (block 820 of FIG. 8).

WORKING EXAMPLE

The following is a working example of the embodiment of the invention which induces electron attachment instabilities in the plasma to control electron temperature by introducing an e-beam current. In this example, the reactor chamber pressure is in the range of about 30mT–40mT, and $SF_6$ gas is supplied into the chamber in support of a tungsten etch process. The plasma density is about $10^{17}$/cc, the initial electron temperature (which is to be reduced) is about 2 eV, the e-beam temperature is about 0.1 eV, and the e-beam velocity is about $10^6$ meters/sec. A slight increase in the e-beam current produces a significant reduction in electron temperature.

While the invention has been described in detail by specific reference to preferred embodiments, it is understood that variations and modifications thereof may be made without departing from the true spirit and scope of the invention.

What is claimed is:

1. A method of reducing electron temperature in a plasma reactor having an RF power control system, said method comprising increasing instabilities between a plasma within the reactor and said control system until said electron temperature is reduced by a desired amount, wherein the step of increasing instabilities comprises introducing electrons into said plasma from a separate source.

2. The method of claim 1 wherein the step of introducing electrons comprises directing an electron beam into said reactor.

3. A method of controlling electron temperature in a plasma reactor having an RF power control system, said method comprising:
   providing a correlation between values of a parameter affecting instability of a plasma in said reactor and electron temperature;
   selecting a desired electron temperature;
   determining from said correlation a value of said parameter corresponding to said desired electron temperature;
   changing the value of said parameter to said corresponding value;
   wherein the step of changing said value of said parameter increases instabilities between a plasma within the reactor and said control system until said electron temperature is reduced to said desired electron temperature; and
   wherein said parameter is electron current flow into said chamber from a source and the step of increasing instabilities comprises increasing said electron current flow.

4. The method of claim 3 wherein said electron current flow comprises an electron beam directed into said reactor.

* * * * *